(12) United States Patent
Behziz et al.

(10) Patent No.: US 9,437,949 B2
(45) Date of Patent: Sep. 6, 2016

(54) ELECTRICAL CABLE ASSEMBLY CONFIGURED TO BE MOUNTED ONTO AN ARRAY OF ELECTRICAL CONTACTS

(71) Applicant: Tyco Electronics Corporation, Berwyn, PA (US)

(72) Inventors: Arash Behziz, Newbury Park, CA (US); Brian Patrick Costello, Scotts Valley, CA (US); Michael David Herring, Apex, NC (US)

(73) Assignee: Tyco Electronics Corporation, Berwyn, PA (US)

( * ) Notice: Subject to any disclaimer, the term of this patent is extended or adjusted under 35 U.S.C. 154(b) by 0 days.

(21) Appl. No.: 14/498,745

(22) Filed: Sep. 26, 2014

(65) Prior Publication Data

US 2016/0093966 A1   Mar. 31, 2016

(51) Int. Cl.
| | |
|---|---|
| *H01R 13/648* | (2006.01) |
| *H01R 12/71* | (2011.01) |
| *H01R 13/6588* | (2011.01) |
| *H01R 13/6595* | (2011.01) |

(Continued)

(52) U.S. Cl.
CPC ........ *H01R 12/716* (2013.01); *H01R 13/6588* (2013.01); *H01R 13/6595* (2013.01); *H01R 12/594* (2013.01); *H05K 1/141* (2013.01)

(58) Field of Classification Search
CPC ............ H01R 13/6658; H01R 23/688; H01R 23/662; H01R 2103/00; H01R 23/005; H01R 4/64; H01R 9/05; H01R 23/3873; H01R 13/65802; H01R 13/658; H02G 7/056; H02G 15/18; H02G 15/013

USPC ...... 439/76.1, 101, 108, 497, 578, 579, 941, 439/607.35, 607.36, 607.41; 174/51, 79, 174/74 R, 75 C, 78, 88 R

See application file for complete search history.

(56) References Cited

U.S. PATENT DOCUMENTS

| | | | |
|---|---|---|---|
| 6,575,772 B1 * | 6/2003 | Soubh | G01R 1/18 439/581 |
| 6,939,174 B2 * | 9/2005 | Wu | H01R 13/514 439/607.05 |
| 7,651,342 B1 * | 1/2010 | Wu | H01R 9/032 439/607.46 |
| 7,664,831 B2 * | 2/2010 | Cartmell | G06F 17/273 707/770 |

(Continued)

FOREIGN PATENT DOCUMENTS

WO     2013006592     1/2013

OTHER PUBLICATIONS

International Search Report dated Oct. 30, 2015 received in PCT Application No. PCT/US2015/047639.

*Primary Examiner* — Thanh Tam Le

(57) ABSTRACT

Cable assembly including a carrier board having a terminating side and a mounting side that face in opposite directions. The terminating side includes a contact array of electrical contacts. The mounting side includes a mating array of electrical contacts. The contact array and the mating array are interconnected to each other through conductive pathways of the carrier board. The contact array along the terminating side overlaps with the mating array along the mounting side. The carrier board is configured to be mounted onto an electrical component having a two-dimensional array. The cable assembly also includes a plurality of cables having cable end portions that are coupled to the carrier board. The cable assembly includes a shield assembly that extends over the terminating side and covers the cable end portions and the contact array.

20 Claims, 10 Drawing Sheets

(51) Int. Cl.
*H01R 12/59* (2011.01)
*H05K 1/14* (2006.01)

(56) References Cited

U.S. PATENT DOCUMENTS

| | | | | |
|---|---|---|---|---|
| 8,011,950 B2* | 9/2011 | McGrath | ............. | H01R 12/594 |
| | | | | 439/497 |
| 8,267,718 B2* | 9/2012 | Straka | ................ | H01R 13/6471 |
| | | | | 439/497 |
| 8,770,990 B2* | 7/2014 | Sytsma | ................. | H01R 9/034 |
| | | | | 439/76.1 |
| 8,840,432 B2* | 9/2014 | Alden, III | ............ | H01R 13/648 |
| | | | | 439/607.35 |
| 8,851,905 B2* | 10/2014 | Soubh | ................ | H01R 13/6658 |
| | | | | 439/499 |
| 9,011,177 B2* | 4/2015 | Lloyd | ................... | H01B 11/00 |
| | | | | 439/607.47 |
| 9,124,037 B2* | 9/2015 | Smink | ................. | H01R 13/646 |
| 2004/0018767 A1 | 1/2004 | Buck et al. | | |
| 2012/0052699 A1* | 3/2012 | MacDougall | ......... | H01R 9/035 |
| | | | | 439/55 |
| 2013/0045611 A1 | 2/2013 | MacDougall | | |
| 2013/0280955 A1 | 10/2013 | Alden, III et al. | | |

* cited by examiner

ELECTRICAL CABLE ASSEMBLY CONFIGURED TO BE MOUNTED ONTO AN ARRAY OF ELECTRICAL CONTACTS

BACKGROUND OF THE INVENTION

The subject matter herein relates generally to cable assemblies that are configured to communicate data signals between different communication systems or devices.

Communication systems, such as routers, servers, uninterruptible power supplies (UPSs), supercomputers, and other computing systems, may be large complex systems that have a number of components interconnected to one another through cable assemblies. For example, a backplane communication system may include several daughter card assemblies that are interconnected to a common backplane. One or more of the daughter card assemblies may include a circuit board having an integrated circuit and a land grid array (LGA) socket that are mounted thereto. The integrated circuit is configured to receive data signals from and/or transmit data signals to electrical contacts of the LGA socket. The LGA socket typically includes a housing that holds a two-dimensional array of the electrical contacts (hereinafter the "socket array"). The housing forms a seating space that is accessed from above the housing.

In at least one known communication system, the LGA socket engages an optical engine that is mounted onto the LGA socket. The optical engine is positioned within the seating space and includes a mating array of electrical contacts that engage the electrical contacts of the socket array. The optical engine converts the data signals from an electrical form to an optical form (or vice versa). The optical engine also engages an optical cable assembly that is connected to a remote component (or components). As such, the integrated circuit may be communicatively coupled to the remote component through the LGA socket, the optical engine, and the optical cable assembly.

Converting data signals between an electrical form and an optical form, however, can consume a substantial amount of power. For applications in which the LGA socket and the remote component are relatively close to each other, such as less than twenty (20) meters, it may be less expensive to directly connect the LGA socket to the remote component through an electrical cable assembly. Electrical cable assemblies that are presently used today, however, are not configured for mating with an LGA socket. For example, a conventional electrical cable assembly includes an input/output (I/O) pluggable module that has a leading end that is inserted into a receptacle assembly mounted to a circuit board. To mate the I/O pluggable module and the receptacle assembly, the leading end of the I/O pluggable module is inserted into the receptacle assembly in a mating direction that is parallel to the circuit board. The LGA socket, however, is configured to receive a component moved in a mounting direction that is perpendicular to the circuit board. Moreover, the I/O pluggable module has a mating interface that is not configured to engage an interface of the LGA socket.

Accordingly, a need exists for an electrical cable assembly having a cable connector that is capable of being mounted onto an electrical component, such as an LGA socket, having a two-dimensional array of electrical contacts.

BRIEF DESCRIPTION OF THE INVENTION

In an embodiment, a cable assembly is provided that includes a carrier board having a terminating side and a mounting side that face in opposite directions. The terminating side includes a contact array of electrical contacts. The mounting side includes a mating array of electrical contacts. The contact array and the mating array are interconnected to each other through conductive pathways of the carrier board. The contact array along the terminating side overlaps with the mating array along the mounting side. The carrier board is configured to be mounted onto an electrical component having a two-dimensional array such that the mating array electrically engages the two-dimensional array. The cable assembly also includes a plurality of cables having cable end portions that are coupled to the carrier board. The cable end portions include exposed signal conductors that are terminated to corresponding electrical contacts of the contact array. The cable assembly includes a shield assembly that is coupled to the carrier board. The shield assembly extends over the terminating side and covers the cable end portions and the contact array.

In some embodiments, the contact array defines a termination area and the mating array defines a mounting area. The termination and mounting areas may overlap each other such that the termination area extends over a majority of the mounting area.

In some embodiments, at least some of the cables form a first cable set that extends adjacent to the terminating side, and at least some of the cables form a second cable set that extends directly over the first cable set. The first and second cable sets may extend parallel to each other over the terminating side.

In an embodiment, a cable assembly is provided that includes a carrier board having a terminating side and a mounting side that face in opposite directions. The terminating side includes a contact array of electrical contacts. The mounting side includes a mating array of electrical contacts. The contact array and the mating array are interconnected to each other through conductive pathways of the carrier board, wherein the electrical contacts of the contact array include signal contacts that form two signal rows. The cable assembly also includes a plurality of cables having exposed signal conductors. The cables form a first cable set and a second cable set. The signal conductors of the cables of the first cable set are terminated to the signal contacts of one of the signal rows. The signal conductors of the cables of the second cable set are terminated to the signal contacts of the other signal row. The first cable set forms a first layer that extends adjacent to the terminating side, and the second cable set forms a second layer that extends directly over the first layer. The first and second layers extend parallel to each other over the terminating side.

In some embodiments, the cable assembly may include a ground shield that is coupled to the terminating side and separates the first and second layers of the cables. Optionally, the ground shield may include a plurality of channels that receive corresponding cables of the second cable set. The channels may be partially defined by ramps of the ground shield that direct the corresponding cables of the second cable set to be positioned above the first cable set.

In an embodiment, a cable assembly is provided that includes a carrier board having a terminating side and a mounting side that face in opposite directions. The terminating side extends parallel to a longitudinal axis and a lateral axis that are perpendicular to each other. The terminating side includes a contact array of electrical contacts. The mounting side includes a mating array of electrical contacts. The contact array and the mating array are interconnected to each other through conductive pathways of the carrier board. The electrical contacts of the contact array form a lateral group that includes a plurality of pad sets. Each of the pad sets including a pair of signal pads and a ground pad. The pad sets alternate between a first longitudinal position and a second longitudinal position as the lateral group extends laterally across the terminating side. The cable assembly also includes a plurality of cables each having a pair of signal conductors that are terminated to the signal pads of a corresponding pad set. Each of the cables also including a drain wire or a shielding layer that is terminated to the ground pad of the corresponding pad set.

DETAILED DESCRIPTION OF THE INVENTION

Embodiments set forth herein include cable assemblies or cable connectors that have two-dimensional arrays of electrical contacts. As used herein, the phrase "a plurality of," when used in the detailed description or the claims, does not necessarily include each and every element that a component may have. For example, the phrase "a plurality of electrical contacts" does not necessarily include each and every electrical contact that may be located along a side of the carrier board. Likewise, the phrase "an array of electrical contacts" (or the like) does not necessarily include each and every electrical contact that may be located along a side of the carrier board.

Figure 1:
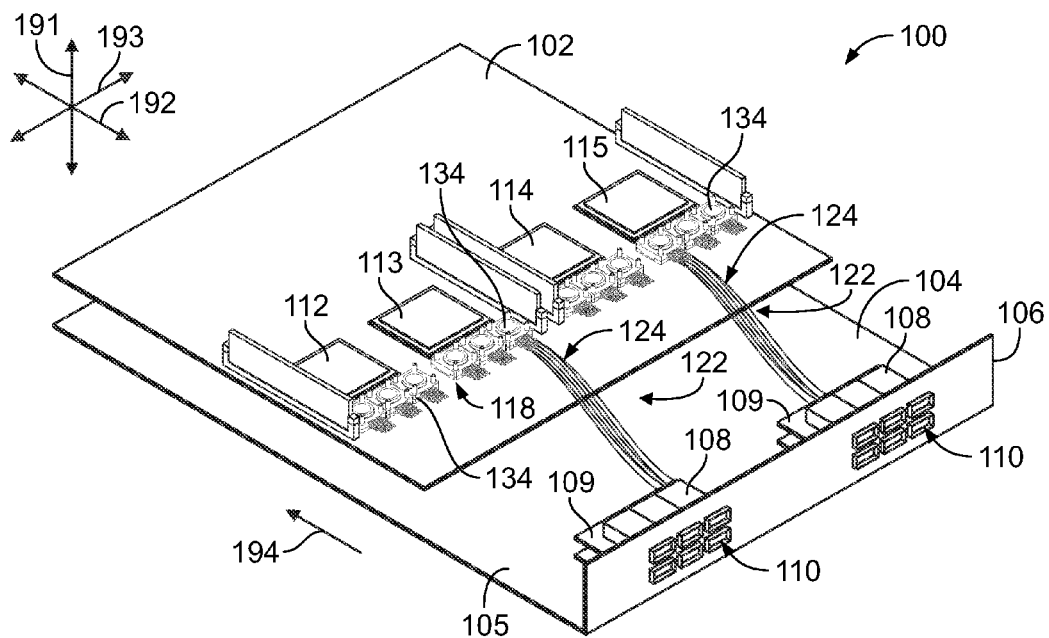
FIG. 1 is a perspective view of a communication system illustrating a plurality of cable assemblies formed in accordance with an embodiment.

FIG. 1 is a perspective view of a communication system or device 100. In some embodiments, the communication system 100 is a daughter card assembly that is configured to engage a backplane communication system. The communication system 100 may be part of a router, server system, uninterruptible power supply (UPS), supercomputer, or other computing system. However, it should be understood that embodiments set forth herein may be used in other applications. The communication system 100 includes a circuit board 102 and a system frame 104. The system frame 104 has a base wall 105 and a support wall 106 that are coupled to each other. The base wall 105 may be secured to the circuit board 102. The support wall 106 extends perpendicular to the base wall 105. For reference, FIG. 1 illustrates mutually perpendicular axes 191, 192, 193, including a mounting axis 191, a longitudinal axis 192, and a lateral axis 193.

The communication system 100 has a number of devices, including a plurality of receptacle assemblies 108 that are mounted to corresponding receptacle cards 109 and secured to the support wall 106. The support wall 106 may face an exterior of the communication system 100. The receptacle assemblies 108 and/or the support wall 106 may define ports 110. The ports 110 are configured to receive input/output (I/O) pluggable modules (not shown) that mate with corresponding receptacle assemblies 108. By way of example, the I/O pluggable modules may be small-form factor pluggable (SFP) transceivers, quad small-form factor pluggable (QSFP) transceivers, or the like. When the I/O pluggable modules are inserted through the ports 110, the I/O pluggable modules are moved in a mating direction 194 that is parallel to the circuit board 102. The mating direction 194 is parallel to the longitudinal axis 192.

The communication system 100 also includes a number of integrated circuits 112, 113, 114, 115 that are mounted to the circuit board 102. Each of the integrated circuits 112-115 is communicatively coupled to a plurality of electrical components 118. Each of the integrated circuits 112-115 is configured to receive input data signals, process the input data signals in a designated manner, and provide output data signals. The input data signals may be communicated through the circuit board 102 from one or more of the electrical components 118 and/or another electrical component (not shown). Similarly, the output data signals may be communicated through the circuit board 102 to one or more of the electrical components 118 and/or another electrical component (not shown). In an exemplary embodiment, the electrical components 118 are land grid array (LGA) sockets, but other electrical components 118 may be used. Each of the electrical components 118 may be located adjacent to one of the integrated circuits 112-115.

The communication system 100 also includes a plurality of electrical cable assemblies 122. Each of the electrical cable assemblies 122 includes a cable bundle 124 of cables 126, 127, 128 (shown in FIG. 2). For illustrative purposes, only two of the cable bundles 124 are shown. Each of the electrical cable assemblies 122 also includes a cable connector 134 and one of the receptacle assemblies 108. In other embodiments, however, at least one of the electrical cable assemblies 122 may communicatively couple the corresponding cable connector 134 to another electrical component. For example, at least one of the electrical cable assemblies 122 may include two cable connectors 134 that are interconnected by the cable bundle 124.

Figure 2:
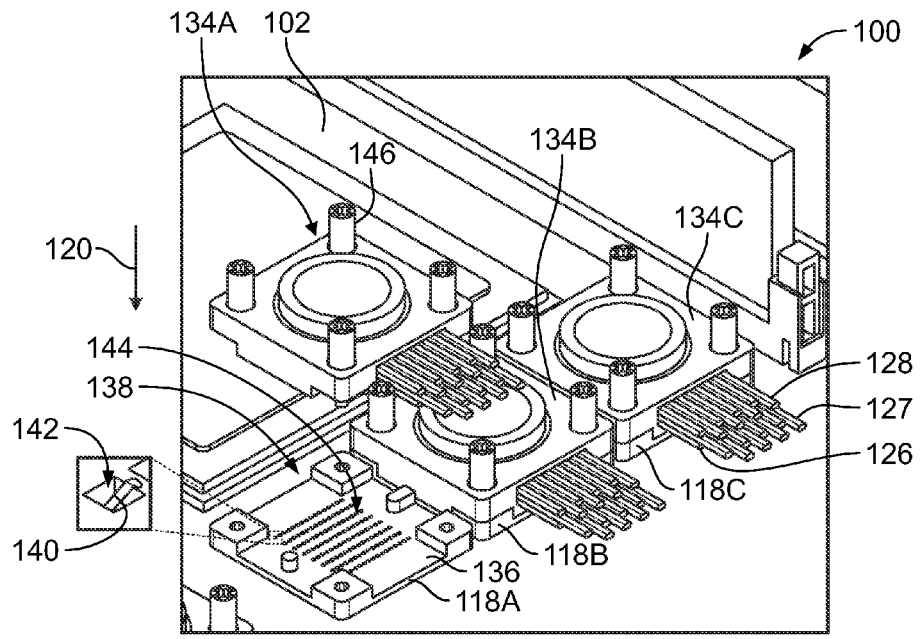
FIG. 2 is an enlarged perspective view of the communication system illustrating cable connectors of the cable assemblies of FIG. 1.

FIG. 2 is an enlarged view of the communication system 100. As shown, cable connectors 134B and 134C are mounted to the electrical components 118B, 118C, respectively. A cable connector 134A is positioned above the electrical component 118A. Each of the electrical components 118A-118C includes a component housing 136 and a two-dimensional array 138 of electrical contacts 140. The two-dimensional array 138 is hereinafter referred to as a socket array 138. The component housing 136 includes an array of cavities 142 that each receives one of the electrical contacts 140. The electrical contacts 140 are communicatively coupled to the circuit board 102.

With respect to the electrical component 118A, the component housing 136 has a seating space or area 144 located along a top of the component housing 136. The seating space 144 is configured to receive a portion of the cable connector 134A when the cable connector 134A is mounted onto the electrical component 118A. When the cable connector 134A is mounted onto the electrical component 118A, the cable connector 134A is moved in a mounting direction 120 that is perpendicular to the circuit board 102 and parallel to the mounting axis 191 (FIG. 1). As shown in FIG. 2, however, the cables 126-128 project away from the cable connector 134A in a direction that is parallel to the circuit board 102.

Each of the cable connectors 134A-134C includes fasteners 146 that secure the corresponding cable connector to the corresponding electrical component 118A-118C. In the illustrated embodiment, the fasteners 146 are screws, but it should be understood that other fasteners may be used. In some embodiments, the fasteners 146 provide a mounting force in the mounting direction 120 that presses the corresponding cable connector against the corresponding electrical component. As such, electrical contacts 261 (shown in FIG. 5) of the cable connectors 134A-134C may electrically engage the electrical contacts 140 of the socket array 138.

Figure 3:
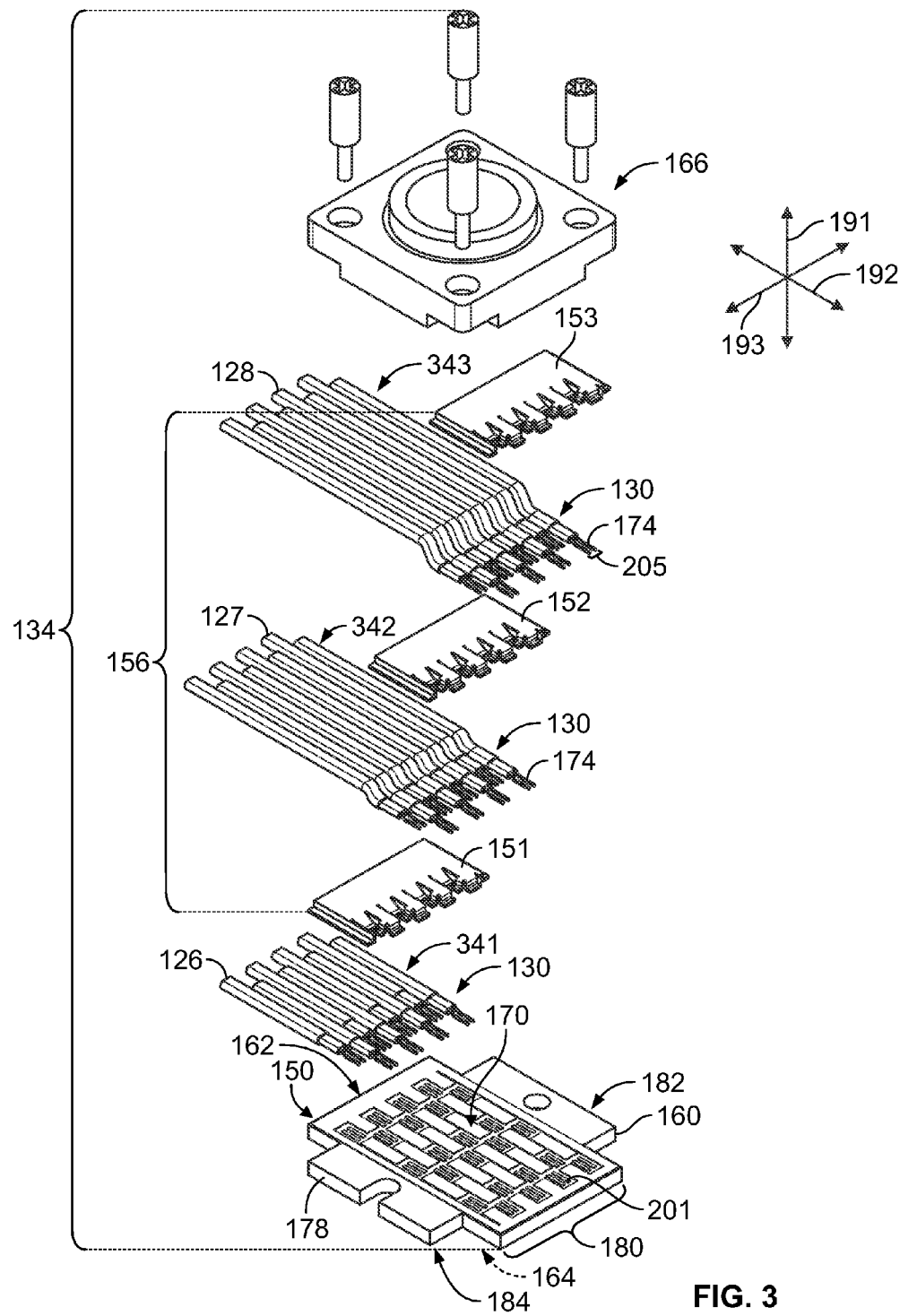
FIG. 3 is an exploded view of a portion of an exemplary cable assembly formed in accordance with an embodiment.

FIG. 3 is an exploded view of an exemplary cable connector 134 of the cable assembly 122 (FIG. 1). As shown, the cable connector 134 may include a carrier board 150 and a shield assembly 156. Optionally, the cable connector 134 may include a cover housing 166 that couples to the carrier board 150 and extends over the shield assembly 156. The cable connector 134 also includes cable end portions 130 of the cables 126-128. In FIG. 3, the cables 126 are arranged in a first cable set 341, the cables 127 are arranged in a second cable set 342, and the cables 128 are arranged in a third cable set 343. Alternative embodiments may include more or fewer cable sets. The cables 126-128 may be a common type of cable and have identical components and features. Each of the cable end portions 130 is configured to be mechanically and electrically coupled to the carrier board 150. The shield assembly 156 may also be mechanically and electrically coupled to the carrier board 150. The shield assembly 156 is configured to shield the cable end portions 130 from one another to reduce crosstalk. In the illustrated embodiment, the shield assembly 156 includes ground shields 151, 152, 153 which may be termed a first ground shield, a second ground shield, and a third ground shield, respectively. In other embodiments, the shield assembly 156 may include more ground shields or fewer ground shields, such as a single ground shield. In other embodiments, the ground assembly 156 may include ground shields with configurations that are different than those shown in FIG. 3.

The carrier board 150 includes a board substrate 160 having a terminating side 162 and a mounting side 164 that face in opposite directions along the mounting axis 191. In some embodiments, the carrier board 150 is a printed circuit board (PCB) having multiple dielectric layers and conductive layers, such as ground planes, that are typically used in printed circuit technology. The board substrate 160, however, may be formed from other dielectric materials, such as plastic, ceramic, glass, etc. The board substrate 160 has conductive pathways 280 (shown in FIG. 5) that extend between the terminating and mounting sides 162, 164.

The terminating side 162 includes a contact array 170 of electrical contacts 201. When the cable connector 134 is fully assembled, the shield assembly 156 extends over the terminating side 162 and covers the cable end portions 130 and the contact array 170. In an exemplary embodiment, each of the cables 126-128 includes a pair 205 of exposed signal conductors 174 that are terminated to the electrical contacts 201 during assembly of the cable connector 134. The cable end portions 130, the ground shields 151-153, and the cover housing 166 may be mounted to the terminating side 162. As described in greater detail below, the cables 126-128 are stacked relative to each other along the mounting axis 191 and electrically coupled to corresponding electrical contacts 201 that are spaced apart along the longitudinal and lateral axes 192, 193. The ground shields 151-153 are electrically coupled to the terminating side 162 and positioned to shield the cable end portions 130 from one another.

In some embodiments, the cover housing 166 is coupled to the carrier board 150 such that the cover housing 166 extends over and protects the ground shields 151-153 and the cables 126-128. The cover housing 166 may surround and hold the cables 126-128 with respect to the carrier board 150 to provide strain relief for the cables 126-128.

The mounting side 164 is configured to be mounted onto an electrical component, such as one of the electrical components 118A-118C (FIG. 2). The carrier board 150 includes a board edge 178 that defines a profile of the carrier board 150 and the board substrate 160 and extends between the terminating side 162 and the mounting side 164. As shown, the carrier board 150 includes a main portion 180 and board extensions 182, 184. The main portion 180 includes the contact array 170. The board extensions 182, 184 extend in opposite directions along the lateral axis 193 away from the main portion 180. The board extensions 182, 184 may be configured to support the cover housing 166 and provide structural integrity to the carrier board 150. In the illustrated embodiment, the board extensions 182, 184 do not include the contact array 170.

Figure 4:
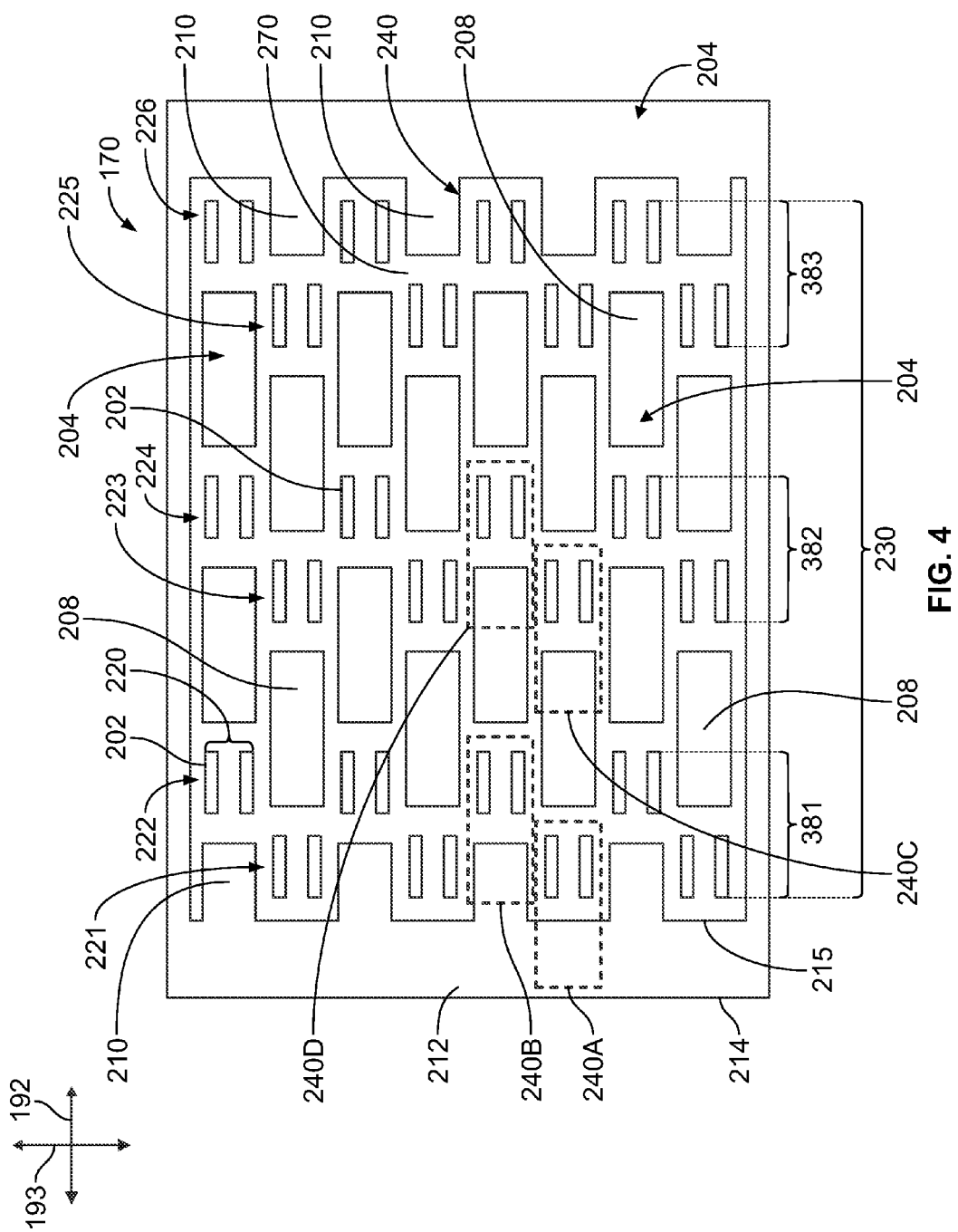
FIG. 4 is a plan view of a contact array along a terminating side of a carrier board that may be used with the cable assembly of FIG. 3.

FIG. 4 is a plan view of the contact array 170. The contact array 170 may coincide with a plane that extends parallel to the longitudinal axis 192 and the lateral axis 193. The contact array 170 is configured to electrically couple to the cable end portions 130 (FIG. 3). To this end, the contact array 170 has electrical contacts 201 that include signal contacts 202 and ground contacts 204. In the illustrated embodiment, the signal contacts 202 are discrete signal pads that have an elongated rectangular shape with the longer dimension extending parallel to the longitudinal axis 192. The ground contacts 204 include a ground border 212 that forms ground pads 210. The ground pads 210 are extensions of the ground border 212 and, as such, are electrically coupled to one another. The ground contacts 204 also include discrete ground pads 208. The discrete signal contacts 202 and the discrete ground pads 208 are spatially separated or isolated from each other and other conductive elements of the contact array 170. In an exemplary embodiment, the signal contacts 202, the ground pads 208, and the ground border 212, including the ground pads 210, may be formed from a common layer of conductive material. For example, during the manufacture of the carrier board 150 (FIG. 3), a layer of conductive material may be etched to define the signal contacts 202, the ground pads 208, and the ground border 212.

The signal contacts 202 form a signal sub-array 230 having corresponding signal rows 221, 222, 223, 224, 225, and 226. The signal contacts 202 may be arranged in signal pairs 220. In the illustrated embodiment, each signal row 221-226 includes four (4) signal pairs 220 that are aligned with one another along the lateral axis 193. The ground border 212 surrounds the signal sub-array 230 and the ground pads 208. The ground border 212 has an outer edge 214 and an inner edge 215. The outer edge 214 may define a perimeter of the contact array 170. The inner edge 215 surrounds the signal sub-array 230 and defines the shapes of the ground pads 210.

Various elements of the cable connector 134 (FIG. 1) may have a lateral position or a longitudinal position with respect to other elements. As used herein, the terms "longitudinal" or "longitudinally" refer to a position or direction along the longitudinal axis 192. The terms "lateral" or "laterally" refer to a position or direction along the lateral axis 193. For example, each of the signal contacts 202 of the signal sub-array 230 may have a lateral position and a longitudinal position relative to other signal contacts 202. The lateral and longitudinal positions of each signal contact 202 may define a unique address of the corresponding signal contact 202 within the contact array 170 or the signal sub-array 230.

It should be understood, however, that the terms "longitudinal" and "lateral" do not require the carrier board 150 to have a particular orientation. For example, it is not necessary for the longitudinal axis 192 to extend along a longer dimension of the carrier board 150 and for the lateral axis 193 to extend along a shorter dimension. In some embodiments, the lateral axis 193 may extend along the longer dimension of the carrier board 150.

The signal contacts 202 and the ground contacts 204 may form pad sets 240. Each of the pad sets 240 includes one of the signal pairs 220 and at least a portion of one of the ground contacts 204. Each of the pad sets 240 may electrically couple to one of the cable end portions 130 (FIG. 3). For instance, the dashed lines that indicate the pad sets 240A, 240B, 240C, and 240D may represent where the corresponding cable end portion 130 interfaces with the contact array 170. The pad set 240A includes one of the signal pairs 220 and a portion of the ground border 212. The pad set 240B includes one of the signal pairs 220 and at least a portion of a corresponding ground pad 210. The pad set 240C includes one of the signal pairs 220 and at least a portion of a corresponding ground pad 208. The pad set 240D includes one of the signal pairs 220 and at least a portion of a corresponding ground pad 208.

Each of the signal contacts 202 is separated or isolated from other conductive material of the contact array 170. For example, a non-conductive surface 270 extends between signal contacts 202 of the same signal pair 220 and between the ground contacts 204 and each signal contact 202. In some embodiments, the ground contacts 204 are arranged to substantially surround each signal pair 220 along the non-conductive surface 270. For example, the signal pair 220 of the pad set 240A is substantially surrounded along three sides by the inner edge 215 of the ground border 212 and the remaining side by one of the ground pads 208. The signal pair 220 of the pad set 240D is substantially surrounded on four sides by four different ground pads 208.

In the illustrated embodiment, the pad sets 240 form a plurality of lateral groups 381, 382, 383. Each of the lateral groups 381-383 includes a sub-array of the contact array 170. For example, each of the lateral groups 381-383 includes a plurality of pad sets 240. In the illustrated embodiment, each of the lateral groups 381-383 includes multiple signal rows. More specifically, the lateral group 381 includes the signal rows 221, 222, the lateral group 382 includes the signal rows 223, 224, and the lateral group 383 includes the signal rows 225, 226. In an exemplary embodiment, the lateral groups 381-383 are covered by corresponding ground shields 151-153 (FIG. 3), respectively.

The pad sets 240 within each of the lateral groups 381-383 may be positioned relative to one another to obtain a designated electrical performance. For instance, the pad sets 240 may be positioned relative to one another to reduce crosstalk between signal pairs 220 or between the pairs 205 (FIG. 3) of signal conductors 174 (FIG. 3). For example, the lateral group 381 includes the pad set 240A and the pad set 240B. The pad set 240A has a first (or rearward) longitudinal position, and the pad set 240B has a different second (or forward) longitudinal position. The different longitudinal positions of the pad sets 240 separate the corresponding signal pairs 220 and may reduce crosstalk. Accordingly, in some embodiments, each of the lateral groups 381-383 may have multiple pad sets 240 that alternate between a first longitudinal position and a second longitudinal position as the corresponding lateral group extends laterally across the terminating side 162.

Figure 5:
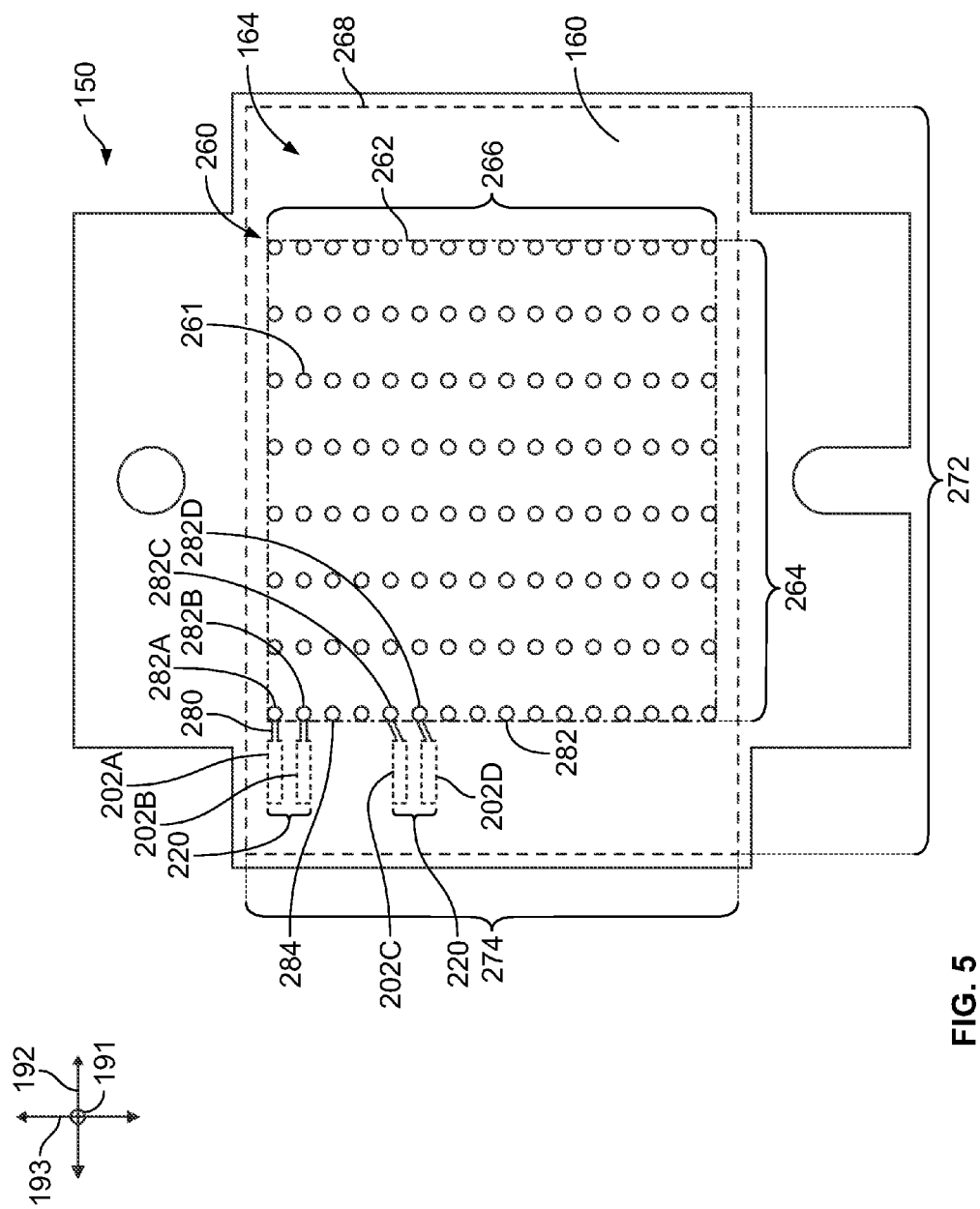
FIG. 5 is a plan view of a mating array of a mounting side of the carrier board that may be used with the cable assembly of FIG. 3.

FIG. 5 is a plan view of the mounting side 164 of the carrier board 150. The mounting side 164 includes a mating array 260 of the electrical contacts 261. In the illustrated embodiment, the mating array 260 is configured to engage the socket array 138 (FIG. 2). Accordingly, the electrical contacts 261 are positioned such that each of the electrical contacts 261 engages a corresponding electrical contact 140 (FIG. 2) of the socket array 138. In certain embodiments, the mating array 260 may have a size, shape, and density that is similar to known area grid arrays, such as LGAs, ball grid arrays (BGAs), or pin grid arrays (PGAs). In the illustrated embodiment, the electrical contacts 261 are contact pads that are configured to engage contact beams of the electrical contacts 140. The electrical contacts 261 may be formed from a common conductive layer that is etched to define the mating array 260. In other embodiments, the electrical contacts 261 are contact beams or solder balls.

The mating array 260 defines a mounting area 262, which is indicated by a dashed line that extends along a perimeter of the mating array 260. The mounting area 262 has a length 264 that extends along the longitudinal axis 192 and a width 266 that extends along the lateral axis 193. The mating array 260 is configured to at least partially overlap with the contact array 170 (FIG. 3) along the terminating side 162 (FIG. 3). For reference, a termination area 268 (also indicated by a dashed line) along the terminating side 162 is shown. The termination area 268 may be defined by the contact array 170. For instance, in an exemplary embodiment, the termination area 268 is defined by the outer edge 214 (FIG. 4) of the ground border 212 (FIG. 4). The contact array 170 has a length 272 that extends along the longitudinal axis 192 and a width 274 that extends along the lateral axis 193. The length 272 and the width 274 define the termination area 268. As shown, the length 272 of the termination area 268 may be greater than the length 264 of the mounting area 262, and the width 274 of the termination area 268 may be greater than the width 266 of the mounting area 262.

In some embodiments, the carrier board 150 has a compact structure such that the contact array 170 (FIG. 3) and the mating array 260 overlap each other. For instance, when viewed in a direction along the mounting axis 191, the contact array 170 extends over at least a majority of the mating array 260 such that the mounting area 262 overlaps at least a majority of the termination area 268. In the illustrated embodiment, the contact array 170 extends over an entirety of the mating array 260 such that the termination area 268 overlaps entirely with the mounting area 262 when viewed along the mounting axis 191. In other embodiments, the contact array 170 extends over only a portion of the mating array 260 or does not overlap with the mating array 260.

In some embodiments, the conductive pathways 280 may extend directly through the carrier board 150 to electrically couple electrical contacts 201 (FIG. 3) of the contact array 170 (FIG. 3) with corresponding electrical contacts 261 of the mating array 260. Each pair of electrical contacts 201, 261 that are electrically coupled by a conductive pathway 280 may be referred to as associated electrical contacts 201, 261. A direct path of the conductive pathway 280 between the associated electrical contacts 201, 261 may enable an improved electrical performance compared to carrier boards 150 having arrays that are not overlapping. As used herein, the phrase "directly through the carrier board" and the like permit at least some jogging by the conductive pathways. In other words, the conductive pathways 280 are not required to extend in a linear direction along the mounting axis 191 through the carrier board 150.

The electrical contacts 261 include signal contacts 282 and ground contacts 284. In some embodiments, the conductive pathways 280 extend through the carrier board 150 such that the signal contacts 282 along the mounting side 164 have the same relative addresses with respect to one another as the signal contacts 202 (FIG. 4) along the terminating side 162 (FIG. 3). By way of example, FIG. 5 illustrates in phantom signal contacts 202A, 202B of a corresponding signal pair 220 and signal contacts 202C, 202D of a corresponding signal pair 220 from the terminating side 162. The signal contacts 202A, 202B of the contact array 170 (FIG. 3) are joined to respective signal contacts 282A, 282B of the mating array 260 through corresponding conductive pathways 280. The signal contacts 202C, 202D of the contact array 170 are joined to respective signal contacts 282C, 282D of the mating array 260 through corresponding conductive pathways 280. Compared to the relative addresses of the signal contacts 202A-202D within the contact array 170, the signal contacts 282A-282D have the same relative addresses within the mating array 260.

In some embodiments, the mating array 260 has a greater density of electrical contacts 261 than the density of electrical contacts 201 (FIG. 3) of the contact array 170 (FIG. 3). For example, the conductive pathways 280 jog between associated signal contacts 202A, 282A to increase a density of the electrical contacts 261 of the mating array 260 along the mounting side 164. The density of the electrical contacts 261 may be similar to densities of known area grid arrays, such as LGAs, BGAs, or PGAs.

Figure 6:
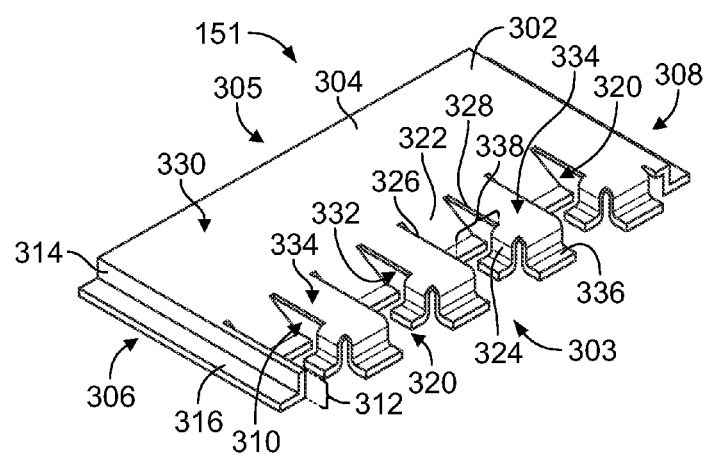
FIG. 6 is a perspective view of a ground shield that may be used with the cable assembly of FIG. 3.

FIG. 6 is a perspective view of an exemplary ground shield 151. In an exemplary embodiment, the ground shields 152, 153 (FIG. 3) are identical to the ground shield 151. In other embodiments, however, the ground shields 151-153 may have different configurations. For simplicity, elements and features of the ground shields 152, 153 may have the same reference numbers as the same elements and features in the ground shield 151. In some embodiments, the ground shields 151-153 may be stamped and formed from sheet metal, such as a copper alloy. Alternatively, the ground shields 151-153 may be molded or 3D-printed using a conductive material, or have a conductive coating.

As shown in FIG. 6, the ground shield 151 includes a shield body 302 having opposite side surfaces 330, 332. For embodiments that are stamped from sheet metal, the side surfaces 330, 332 may be opposite surfaces of the sheet metal prior to stamping. The side surface 330 may generally constitute an exterior surface of the shield body 302, and the side surface 332 may generally constitute an interior surface of the shield body 302. The side surface 332 defines a cable cavity 310 that is configured to receive a plurality of the cable end portions 130 (FIG. 3). The ground shield 151 is configured to be mounted to the carrier board 150 (FIG. 3) and electrically coupled to the terminating side 162 (FIG. 3). For example, the shield body 302 may be terminated to one or more of the ground contacts 204 (FIG. 4).

The ground shield 151 extends between an interface (or front) end 303 and a loading end 305. In the illustrated embodiment, the shield body 302 has a top wall or panel 304 and first and second body supports 306, 308. The top wall 304 is substantially planar in the illustrated embodiment and may extend parallel to the longitudinal and lateral axes 192, 193 (FIG. 1). In other embodiments, however, the top wall 304 may have a non-planar shape. For instance, the top wall 304 may be shaped to partially surround one or more cable end portions 130 (FIG. 3) that are positioned within the cable cavity 310 or that extend over the ground shield 151.

The top wall 304 extends between and joins the first and second body supports 306, 308. In the illustrated embodiment, each of the body supports 306, 308 is L-shaped and includes a sidewall 314 and a grounding wall 316. The sidewalls 314 extend perpendicular to the terminating side 162 (FIG. 3) when mounted thereto and extend a height 312 away from the terminating side 162. The cable cavity 310 is configured to receive a plurality of the cable end portions 130 (FIG. 3) when the ground shield 151 is mounted to the terminating side 162. Accordingly, the height 312 may be based on a size and shape of the cable end portions 130. As shown, the grounding walls 316 extend perpendicular to the corresponding sidewall 314 and are configured to extend along or parallel to the terminating side 162. The grounding walls 316 are configured to be mechanically and electrically coupled to the ground border 212 (FIG. 4).

Optionally, the shield body 302 may include a plurality of channels 320 along the interface end 303. Each of the channels 320 may be defined by a ramp 322 and opposing edges 326, 328. In some embodiments, the ramp 322 is stamped and formed. In such embodiments, the edges 326, 328 may be formed when the sheet metal is stamped to define the ramp 322. The ramp 322 is bent into the cable cavity 310 (or toward the terminating side 162 of the carrier board 150 (FIG. 3)). As such, a bottom of the channel 320 is defined by the side surface 330 along the ramp 322. A width 338 of each channel 320 may extend laterally between the corresponding edges 326, 328. The edges 326, 328 may function as walls or stops that hold a corresponding cable end portion 130 (FIG. 3) therein. When the ground shield 151 is mounted onto the carrier board 150, each of the ramps 322 may be positioned over a signal pair 220 (FIG. 4) of signal contacts 202 (FIG. 4).

The shield body 302 may also include shield extensions 334 that each forms a portion of the interface end 303. In the illustrated embodiment, a pair of the channels 320 that are adjacent to each other are separated by one of the shield extensions 334, and a pair of the shield extensions 334 that are adjacent to each other are separated by one of the channels 320. As described below, each of the shield extensions 334 is configured to extend over a signal pair 220 (FIG. 4) of signal contacts 202 (FIG. 4). In an exemplary embodiment, the shield extensions 334 are at least partially defined when the sheet metal is stamped and formed. More specifically, the shield extensions 334 may be defined when the ramp 322 is stamped from the sheet and bent toward the terminating side 162.

In some embodiments, the shield body 302 may also include a plurality of grounding legs 324 and a plurality of grounding tabs 336. In the illustrated embodiment, each of the shield extensions 334 includes one of the grounding legs 324 and one of the grounding tabs 336. Each of the grounding legs 324 and grounding tabs 336 is configured to directly engage the terminating side 162. In some embodiments, the grounding leg 324 and the grounding tab 336 of a corresponding shield extension 334 may partially surround the pair 205 (FIG. 3) of signal conductors 174 (FIG. 3) that is located below the corresponding shield extension 334.

Figure 7:
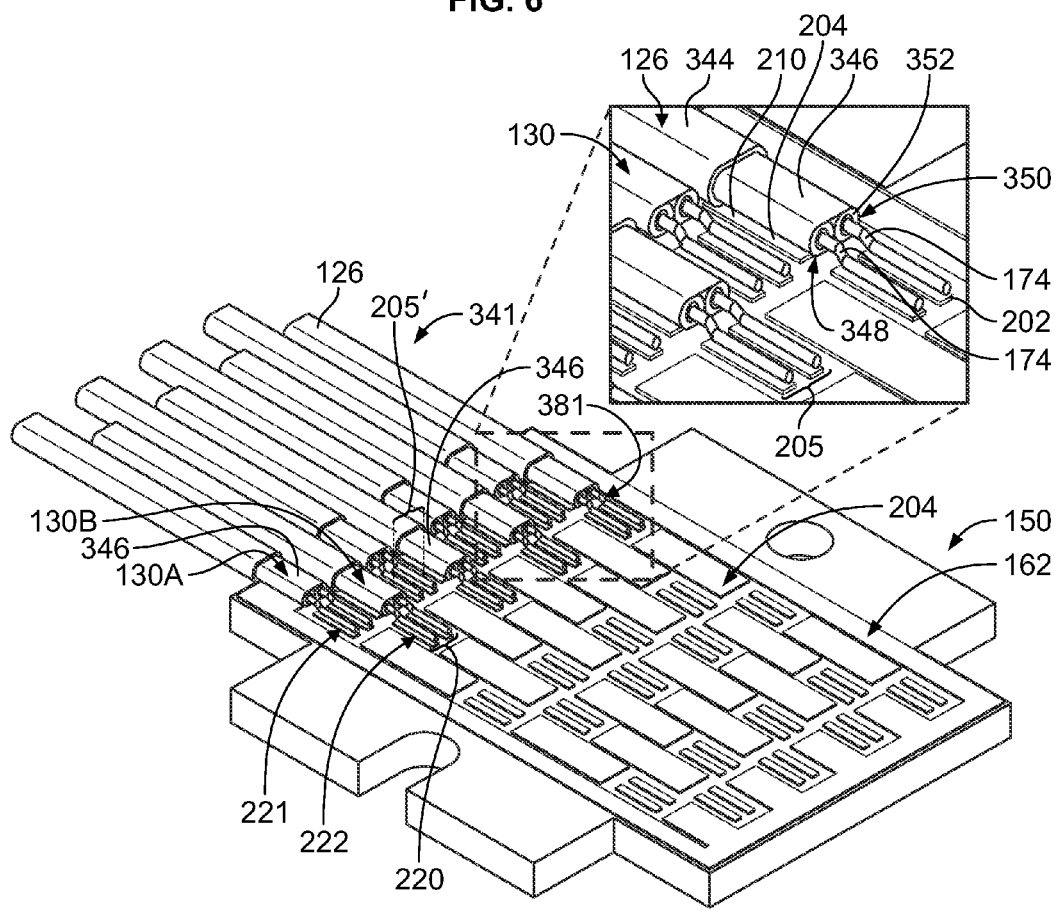
FIG. 7 illustrates one assembly stage during the manufacture of the cable assembly of FIG. 3.
Figure 9:
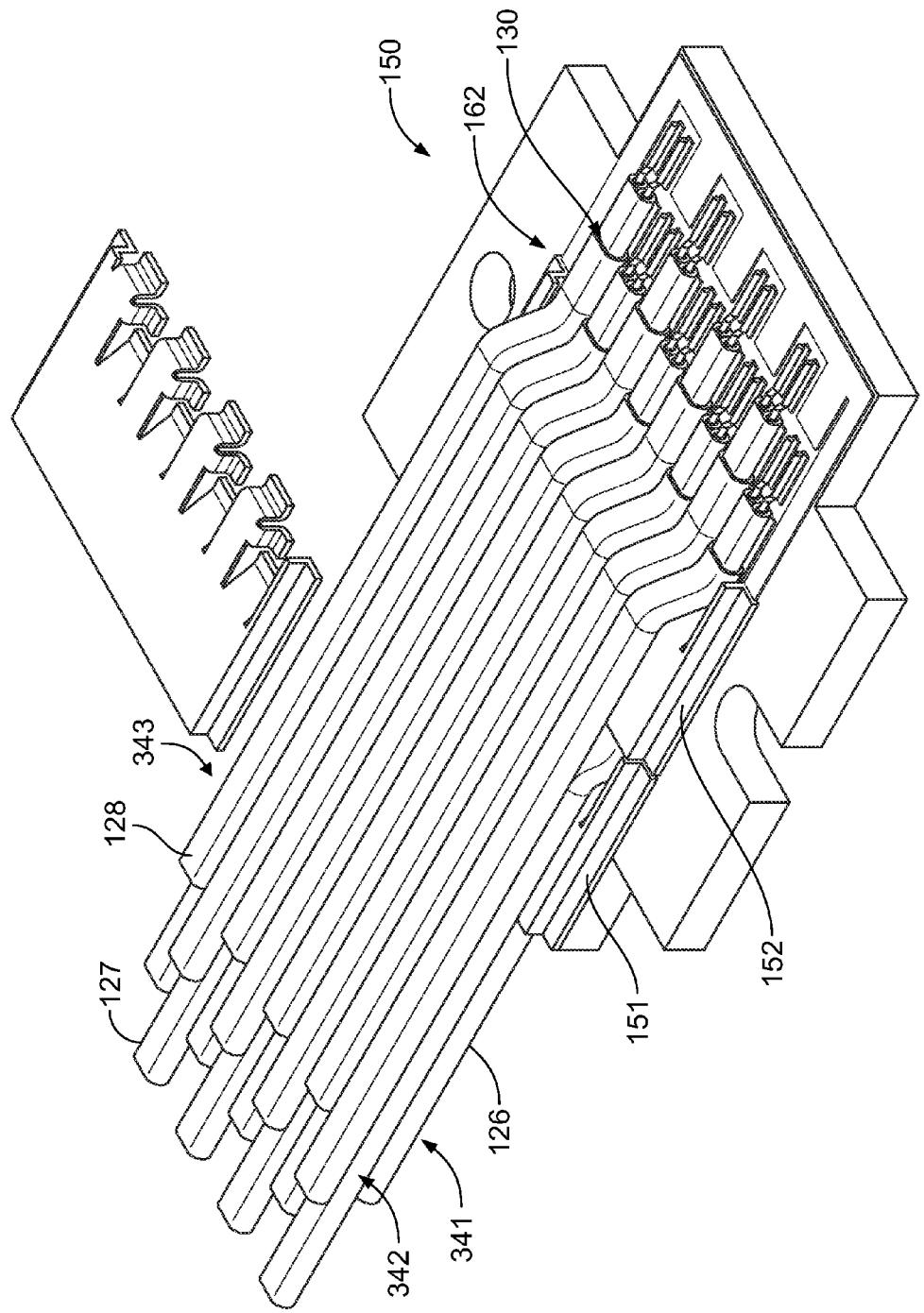
FIG. 9 illustrates another assembly stage during the manufacture of the cable assembly of FIG. 3.
Figure 10:
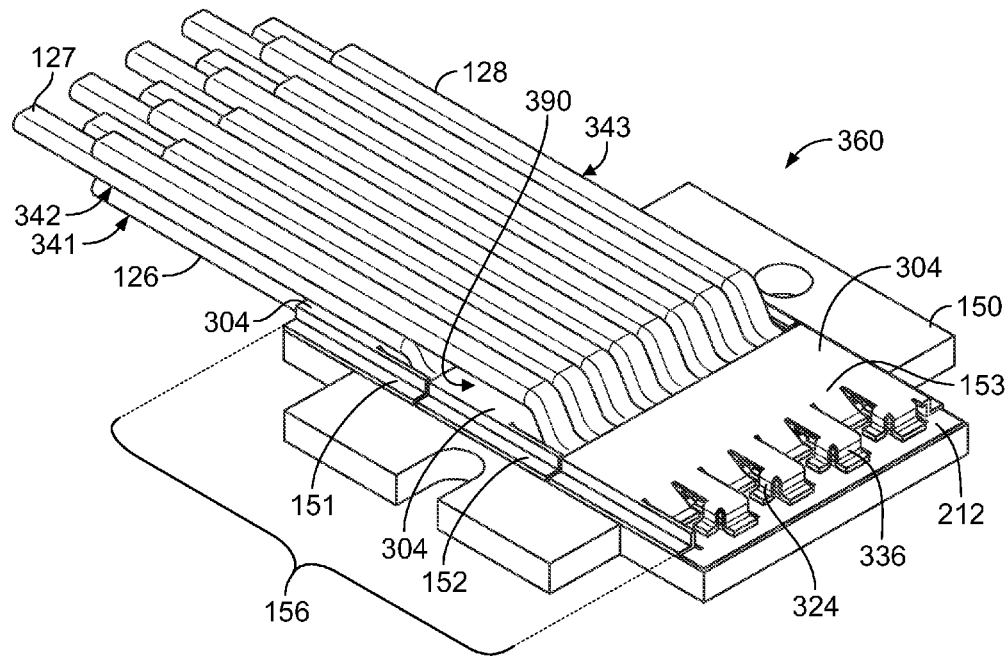
FIG. 10 illustrates another assembly stage during the manufacture of the cable assembly of FIG. 3.
Figure 11:
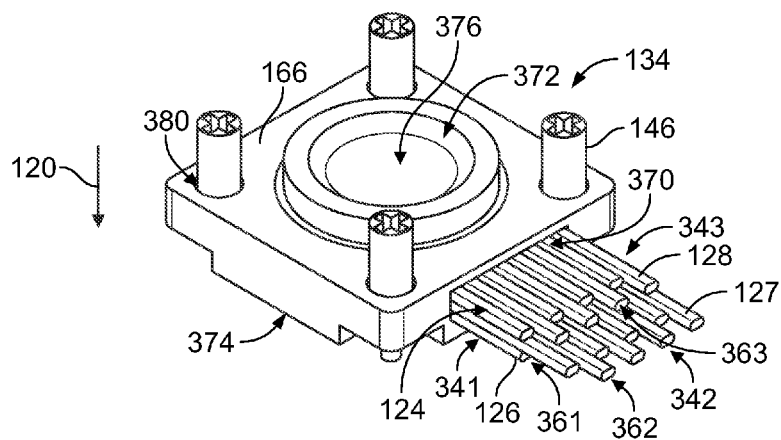
FIG. 11 is a perspective view of a cable connector of the cable assembly of FIG. 3.

FIGS. 7-11 illustrate different stages for assembling the cable connector 134 (FIG. 11). It should be understood, however, that the following only describes one process for assembling the cable connector 134 and that alternative processes may be used. FIG. 7 is a perspective view of the carrier board 150 and the cables 126 of the first cable set 341 terminated to the carrier board 150. Although the following is with specific reference to the cables 126, the description may also be applied to the cables 127, 128 (FIG. 3). As shown in the enlarged view of FIG. 7, each of the cables 126 includes an insulative jacket 344 and a shielding layer 346. The insulative jacket 344 surrounds the shielding layer 346 that, in turn, surrounds a pair of insulated wires 348, 350 of the cable 126. Each of the insulated wires 348, 350 includes a dielectric layer 352 and one of the signal conductors 174 that is surrounded by the dielectric layer 352. The insulative jacket 344 is stripped to expose the shielding layer 346, and the insulated wires 348, 350 are stripped to expose the signal conductors 174.

In the illustrated embodiment, the pair of insulated wires 348, 350 extend parallel to each other along a length of the cable 126. As such, the cable 126 has a parallel-pair configuration. However, the parallel-pair configuration of the cable 126 is just one example of the various configurations that the cables 126-128 may have. For example, the insulated wires 348, 350 may not extend parallel to each other and, instead, may form a twisted pair of insulated wires. In other embodiments, the cable 126 may include only a single insulated wire or more than two insulated wires. In alternative embodiments, the cable 126 may also include more than one pair of insulated wires (e.g., four pairs).

During the assembly stage shown in FIG. 7, the signal conductors 174 are mechanically and electrically coupled to the terminating side 162. For example, as shown in the enlarged view of FIG. 7, each of the signal conductors 174 may be welded to a corresponding signal contact 202. Other terminating processes, such as soldering, may be used to electrically couple the signal conductors 174 to the corresponding signal contacts 202.

Before, after, or while the signal conductors 174 are terminated to the corresponding signal contacts 202, the shielding layer 346 may be electrically coupled to one of the ground contacts 204. In some embodiments, the shielding layers 346 may be welded to the corresponding ground contacts 204. In other embodiments, the shielding layers 346 are not fixedly secured to the corresponding ground contacts 204 through welding or soldering. In such embodiments, the shielding layers 346 may be held against the corresponding ground contacts 204. For example, the ground shield 151 (FIG. 3) may be sized and shaped to engage and compress the cable end portions 130 when the ground shield 151 is mounted to the terminating side 162 such that the shielding layers 346 are pressed against the corresponding ground contacts 204.

The cables 126 of the first cable set 341 are configured to electrically couple to the signal pairs 220 of the first and second signal rows 221, 222. More specifically, the cables 126 may electrically couple to the lateral group 381. In an exemplary embodiment, the cable end portions 130 alternate between different longitudinal positions such that adjacent cable end portions 130 of the first cable set 341 have different longitudinal positions along the terminating side 162. For example, the cable end portion 130A has a first (or rearward) longitudinal position along the terminating side 162, and the cable end portion 130B has a second (or forward) longitudinal position along the terminating side 162. In such embodiments, the first and second longitudinal positions of the cable end portions 130 may separate adjacent pairs 205 of the signal conductors 174 to reduce crosstalk.

Due to the alternating longitudinal positions of the cable end portions 130, some of the signal conductors 174 that are terminated to the signal pairs 220 of the first signal row 221 will be positioned between the shielding layers 346 of two cable end portions 130 that are terminated to the signal pairs 220 of the second signal row 222. In such embodiments, the pairs 205 of signal conductors 174 may be surrounded by grounded material after the ground shield 151 (FIG. 6) is mounted to the terminating side 162. By way of example, FIG. 7 illustrates one pair 205' of signal conductors 174. The pair 205' of signal conductors 174 is positioned between two shielding layers 346 of adjacent cables 126. After the ground shield 151 is mounted to the terminating side 162, the ramp 322 (FIG. 6) of the ground shield 151 will be positioned in front of the pair 205' of signal conductors 174 and the top wall 304 (FIG. 6) of the ground shield 151 will be positioned over the pair 205' of signal conductors 174.

Figure 8:
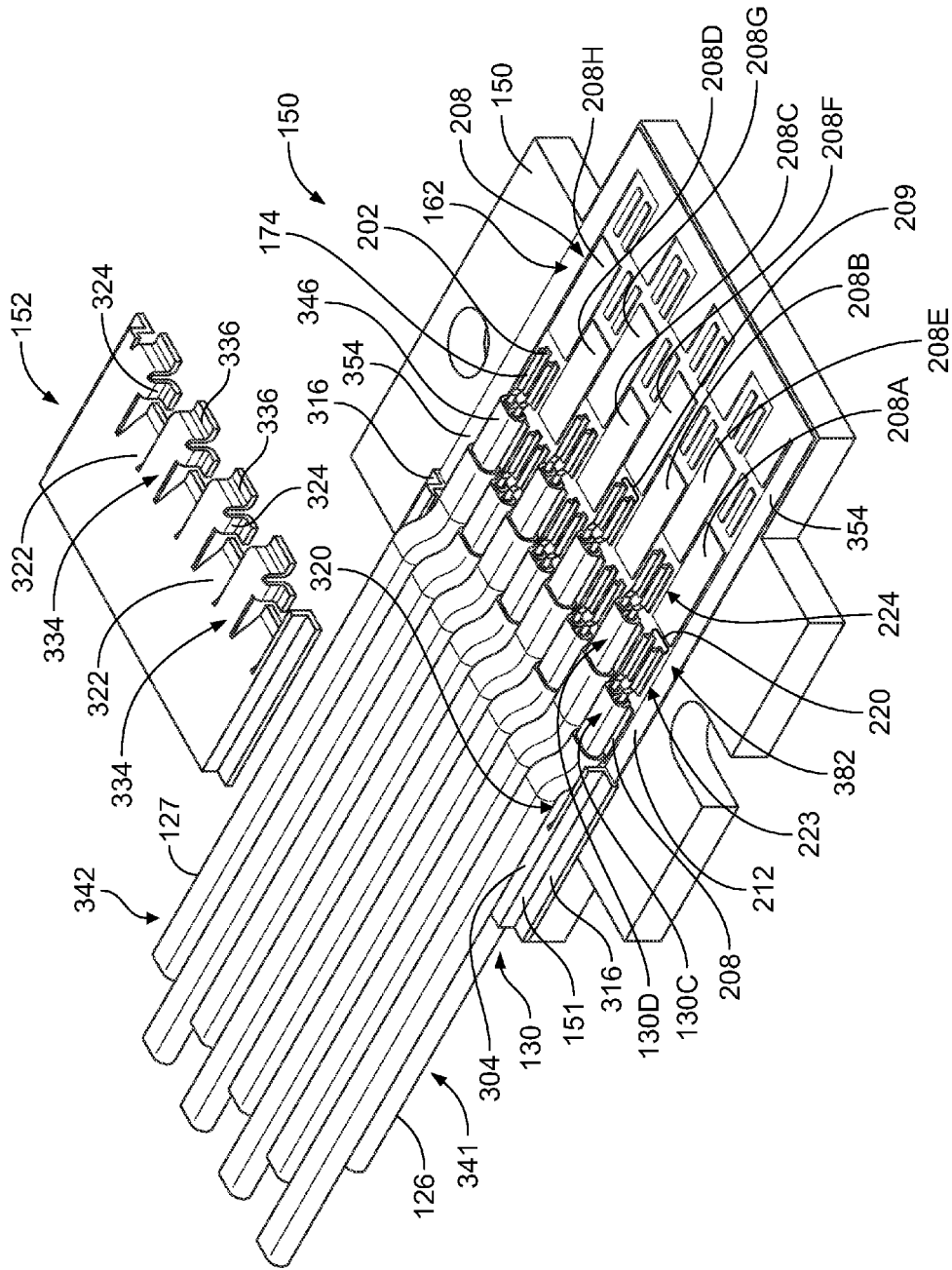
FIG. 8 illustrates another assembly stage during the manufacture of the cable assembly of FIG. 3.

FIG. 8 is a perspective view of the carrier board 150 after the cables 126 of the first cable set 341 and the ground shield 151 have been terminated to the carrier board 150. The ground shield 151 covers the cable end portions 130 of the first cable set 341 and covers the lateral group 381 (FIG. 4). More specifically, the cable end portions 130 of the first cable set 341 are located within the cable cavity 310 (FIG. 6) between the top wall 304 and the terminating side 162 of the carrier board 150. The grounding walls 316 are electrically coupled to the ground border 212. In certain embodiments, each of the grounding walls 316 is electrically coupled to a corresponding longitudinal segment 354 of the ground border 212. The cables 127 of the second cable set 342 have also been coupled to the terminating side 162. The cables 126, 127 extend parallel to one another as the cables 126, 127 extend along the terminating side 162. In the illustrated embodiment, each cable 127 of the second cable set 342 is stacked directly over a corresponding cable 126 of the first cable set 341.

Similar to above, the signal conductors 174 of the cables 127 are mechanically and electrically coupled to the corresponding signal contacts 202. Each of the shielding layers 346 is coupled to a corresponding ground pad 208. As shown, the cables 127 of the second cable set 342 are electrically coupled to the signal pairs 220 of the third and fourth signal rows 223, 224. More specifically, the cables 127 of the second cable set 342 are electrically coupled to the lateral group 382. The cable end portions 130 of the second cable set 342 alternate between different longitudinal positions. The cable end portion 130C has a third longitudinal position along the terminating side 162, and the cable end portion 130D has a fourth longitudinal position along the terminating side 162. The third and fourth longitudinal positions of the cable end portions 130 may effectively separate the corresponding pairs 205 of the signal conductors 174.

The cable end portions 130 of the cables 127 extend over the top wall 304 of the ground shield 151. In particular embodiments, select cable end portions 130 of the second cable set 342 may extend through corresponding channels 320 of the ground shield 151. For example, each of the cable end portions 130 that is electrically coupled to a signal pair 220 in the third signal row 223 extends through one of the channels 320. However, each of the cable end portions 130 that is electrically coupled to a signal pair 220 in the fourth signal row 224 extends over one of the grounding tabs 336 (FIG. 6) and along the corresponding shield extension 334 (FIG. 6).

FIG. 8 also shows the ground shield 152 before the ground shield 152 is mounted to the terminating side 162 of the carrier board 150. The ground pads 208 include ground pads 208A, 208B, 208C, 208D and ground pads 208E, 208F, 208G, 208H. In the illustrated embodiment, the ground pads 208A-208D have a first (or rearward) longitudinal position, and the ground pads 208E-208H have a second (or forward) longitudinal position. The ramps 322 of the ground shield 152 are configured to be electrically coupled to corresponding ground pads 208A-208D. The grounding legs 324 are configured to be electrically coupled to corresponding ground pads 208E-208H. The grounding tabs 336 are also configured to be electrically coupled to corresponding ground pads 208E-208H.

When the ground shield 152 is mounted onto the terminating side 162, the ramps 322 extend over corresponding signal pairs 220 of the third signal row 223, and the shield extensions 334 extend over corresponding signal pairs 220 of the fourth signal row 224. As such, each ramp 322 may extend over a first pair 205 of signal conductors 174 to separate the first pair 205 of signal conductors 174 from an adjacent second pair 205 of signal conductors 174. The grounding leg 324 and the grounding tab 336 of the same shield extension 334 may partially surround the adjacent second pair 205 of signal conductors 174. Also shown, the ground shield 151 separates the cable end portions 130 of the first cable set 341 and the cable end portions 130 of the second cable set 342. In a similar manner, the ground shield 152 may separate the cable end portions 130 of a third cable set 343 (FIG. 3) and the cable end portions 130 of the second cable set 342.

FIG. 9 is a perspective view of the carrier board 150 after the cables 126-128 of the first cable set 341, the second cable set 342, and the third cable set 343, respectively, have been terminated to the carrier board 150 and the first and second ground shields 151, 152 have been terminated to the carrier board 150. The cable end portions 130 of the third cable set 343 may be terminated to the carrier board 150 in a similar manner as the other cable end portions 130 of the first and second cable sets 341, 342. As shown in FIG. 9, the cables 126-128 extend generally parallel to each other as the cables 126-128 extend along the terminating side 162 above the first and second ground shields 151, 152.

FIG. 10 is a perspective view of a communication sub-assembly 360 that includes the carrier board 150, the cables 126-128 of the first, second, and third cable sets 341, 342, 343, respectively, and the shield assembly 156. The shield assembly 156 includes the first, second, and third ground shields 151-153. The grounding legs 324 and the grounding tabs 336 of the ground shield 153 have been terminated to the ground border 212.

In some embodiments, a gap 390 may exist between the cables 128 of the third cable set 343 and the top wall 304 of the ground shield 152. In other embodiments, the cables 128 of the third cable set 343 may engage and extend alongside the top wall 304 of the ground shield 152 such that the gap 390 does not exist or is substantially reduced compared to the gap 390 shown in FIG. 10. In such embodiments, the cables 128 of the third cable set 343 may engage the cables 127 of the second cable set 342 and then bend to extend alongside the cables 127. In the illustrated embodiment, the top walls 304 of the ground shields 151-153 are co-planar. In other embodiments, the top walls 304 may not be co-planar.

FIG. 11 is a perspective view of the cable connector 134 after the cover housing 166 has been provided. The cover housing 166 is configured to generally protect the communication sub-assembly 360 (FIG. 10). The cover housing 166 extends over the shield assembly 156 (FIG. 3) and surrounds the cables 126-128. The cover housing 166 includes an access window 370 that permit the cables 126-128 to exit (or enter) the cover housing 166 such that the cables 126-128 extend parallel to the carrier board 150 (FIG. 3) at the access window 370. In the illustrated embodiment, the first, second, and third cable sets 341-343 form first, second, and third cable layers 361, 362, 363, respectively, of the cable bundle 124. The cable layers 361-363 are stacked over each other at the access window 370 and within the cover housing 166. The first cable layer 361 extends adjacent to the terminating side 162 (FIG. 3), the second cable layer 362 extends directly over the first cable layer 361, and the third cable layer 363 extends directly over the second cable layer 362. The first, second, and third cable layers 361-363 extend parallel to each other over the terminating side 162.

In some embodiments, the cover housing 166 is formed through a molding process in which the communication sub-assembly 360 is positioned within a mold cavity and the cover housing 166 is overmolded onto the communication sub-assembly 360. The access window 370 may be formed during the molding process. Alternatively, the cover housing 166 may be formed when one or more shells are coupled to the carrier board 150 (FIG. 3) and/or each other. When the cover housing 166 is formed, a plurality of passages 380 may be formed that are shaped to receive corresponding fasteners 146. The fasteners 146 extend entirely through the cover housing 166 and are configured to engage corresponding features of the electrical component 118 (FIG. 1).

The cover housing 166 includes an operator-engaging side 372 and a mounting side 374. The mounting side 374 includes the mounting side 164 (FIG. 3) of the carrier board 150 (FIG. 3) and includes the mating array 260 (FIG. 5) of the electrical contacts 261 (FIG. 5). The operator-engaging side 372 may be shaped so that an individual may press the mounting side 374 into the socket array 138 (FIG. 2). For example, the operator-engaging side 372 may include a divot or recess 376 that is shaped to receive a finger, such as a thumb or pointer finger, of the individual. The individual may press the cable connector 134 into the socket array 138 in the mounting direction 120 as the individual (or other person) secures the cable connector 134 to the electrical component. The cover housing 166 may protect the communication sub-assembly 360 as a force is applied to the cover housing 166. As described above, the cover housing 166 also surrounds and holds the cables 126-128 with respect to the carrier board 150 to provide strain relief for the cables 126-128.

Figure 12:
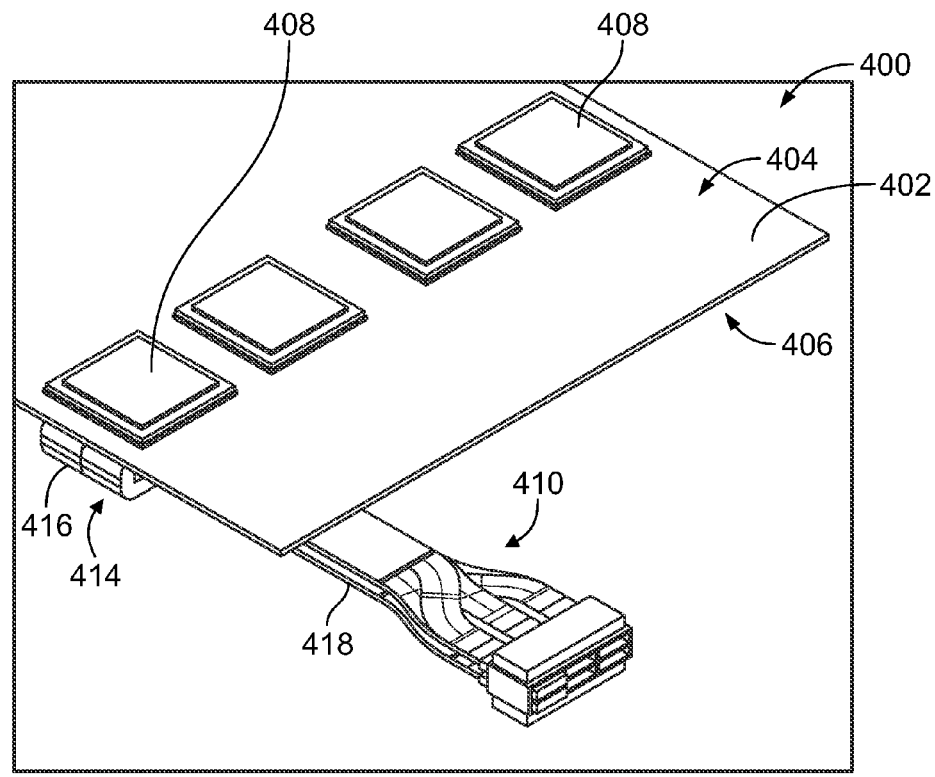
FIG. 12 is a perspective view of a communication system formed in accordance with an embodiment.
Figure 13:
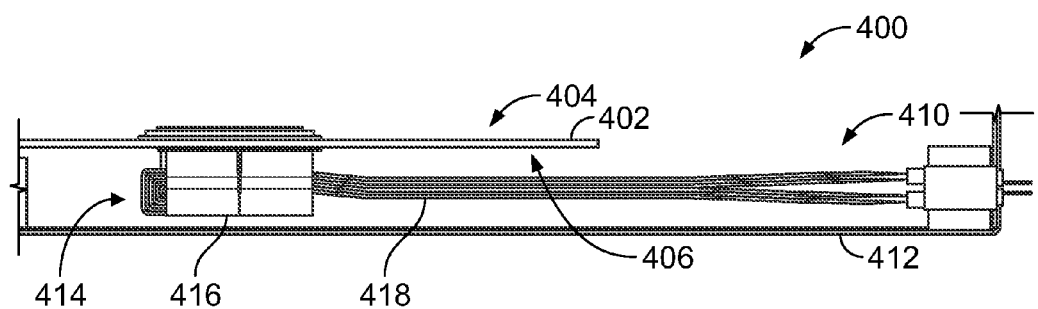
FIG. 13 is a side view of the communication system of FIG. 12 formed in accordance with an embodiment.

FIG. 12 is a perspective view of a communication system 400, and FIG. 13 is a side view of the communication system 400. The communication system 400 may include similar components and features as the communication system 100 (FIG. 1). For example, the communication system 400 includes a circuit board 402 having opposite first and second sides 404, 406 and a plurality of integrated circuits 408 that are mounted to the first side 404 of the circuit board 402. The communication system 400 also includes a cable assembly 410 and a support frame 412 (FIG. 13). The cable assembly 410 includes a cable connector 414 that is coupled to the second side 406 of the circuit board 402. The cable connector 414 includes cables 418 and a cover housing 416 that is configured to surround and hold the cables 418. The cable connector 414 may be secured to the circuit board 402 directly opposite (or directly under) one of the integrated circuits 408. In such embodiments, conductive pathways (not shown) through the circuit board 402 between the cable connector 414 and the corresponding integrated circuit 408 may be reduced compared to other systems in which a connector is not located directly opposite or under the integrated circuit.

Figure 14:
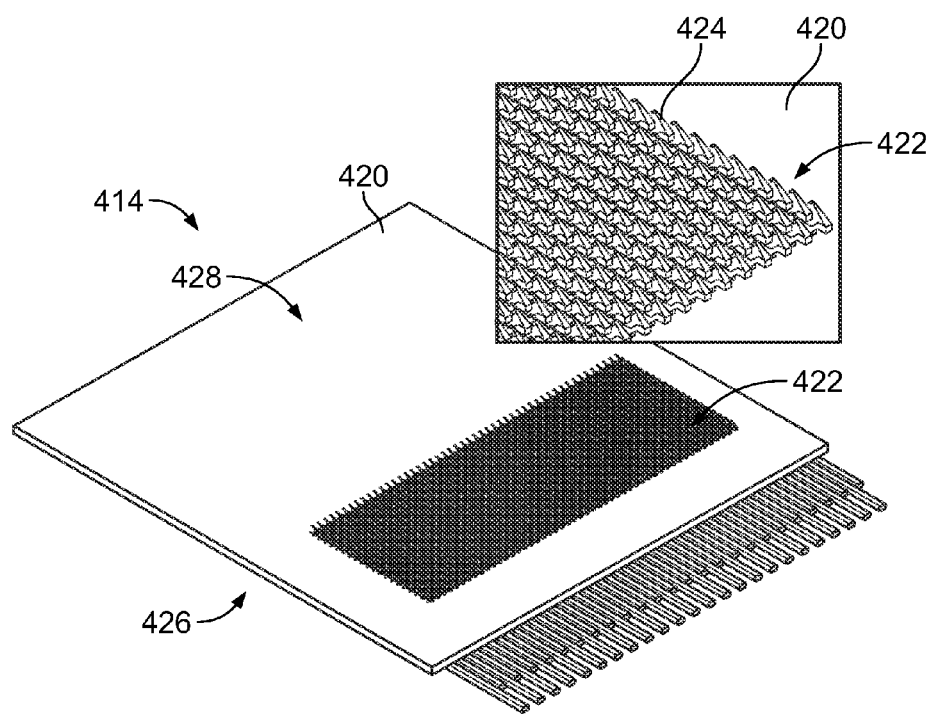
FIG. 14 is isolated view of a cable connector that may be used with the communication system of FIG. 12.

FIG. 14 is a perspective view of a portion of the cable connector 414. The cable connector 414 also includes a carrier board 420 having a terminating side 426 and a mounting side 428 that face in opposite directions. The carrier board 420 includes a mating array 422 of electrical contacts 424 along the mounting side 428. As shown in the enlarged view of FIG. 14, the electrical contacts 424 are contact beams. In other embodiments, the electrical contacts 424 may be solder balls or conductive pads. The mounting side 428 is configured to be mounted to the second side 406 (FIG. 13) of the circuit board 402 (FIG. 13).

Figure 15:
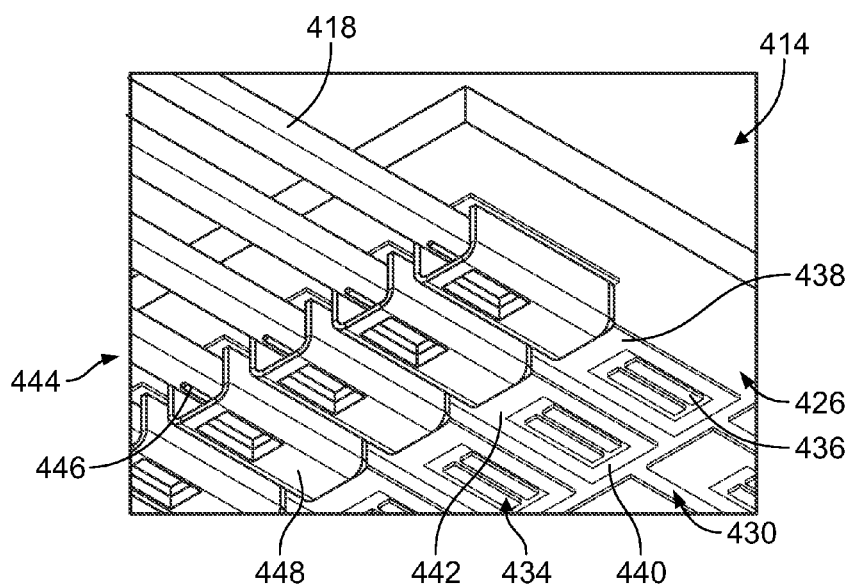
FIG. 15 is an enlarged view of the cable connector of FIG. 14.

FIG. 15 is a perspective view of an enlarged portion of the cable connector 414 illustrating the terminating side 426 in greater detail. For illustrative purposes, the cover housing 416 (FIG. 13) is not shown. The terminating side 426 includes a contact array 430 of electrical contacts that include signal pads 436 and ground pads 438. The electrical contacts are arranged in pad sets 434 in which each pad set 434 includes a pair of signal pads 436 and a ground pad 438. The ground pad 438 includes a border portion 440 that surrounds the pair of the signal pads 436 and a base portion 442 that is electrically coupled to the border portion 440. Similar to the contact array 170 (FIG. 3), the contact array 430 includes multiple rows of the signal pads 436. The signal pads 436 may have a similar arrangement as the signal contacts 202 (FIG. 4).

The cables 418 include cable end portions 444 that are coupled to the terminating side 426. The cable end portions 444 include drain wires 446 and a pair of signal conductors (not shown). In the illustrated embodiment, the cable connector 414 includes a plurality of ground shields 448 in which each ground shield 448 secures one of the cable end portions 444 to the terminating side 426. More specifically, each ground shield 448 is configured to surround one pair of the signal conductors (not shown) and electrically couple to the corresponding drain wire 446. The signal conductors are terminated to the signal pads 436.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled.

As used in the description, the phrase "in an exemplary embodiment" and the like means that the described embodiment is just one example. The phrase is not intended to limit the inventive subject matter to that embodiment. Other embodiments of the inventive subject matter may not include the recited feature or structure. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

What is claimed is:

1. A cable assembly comprising:
a carrier board having a terminating side and a mounting side that face in opposite directions, the terminating side including a contact array of electrical contacts that include a plurality of signal contacts, the mounting side including a mating array of electrical contacts, the contact array and the mating array being interconnected to each other through conductive pathways of the carrier board, wherein the contact array along the terminating side overlaps with the mating array along the mounting side, the carrier board configured to be mounted onto an electrical component having a two-dimensional array such that the mating array electrically engages the two-dimensional array;
a plurality of cables having cable end portions that are coupled to the carrier board, the cable end portions including signal conductors having exposed portions that are terminated to corresponding signal contacts of said plurality; and
a ground shield coupled to the carrier board, the ground shield extending over the terminating side and covering the cable end portions, the exposed portions of the signal conductors, and the corresponding signal contacts.

2. The cable assembly of claim 1, wherein the contact array defines a termination area and the mating array defines a mounting area, the termination and mounting areas overlapping each other such that the termination area extends over a majority of the mounting area.

3. The cable assembly of claim 1, wherein the signal contacts of the contact array include signal pads and the mating array includes signal pads, the conductive pathways extend directly through the carrier board to connect the signal pads of the contact array to corresponding signal pads of the mating array.

4. The cable assembly of claim 1, wherein the electrical contacts of the mating array include at least one of conductive pads or contact beams.

5. The cable assembly of claim 1, wherein at least some of the cables form a first cable set that extends adjacent to the terminating side and at least some of the cables form a second cable set that extends directly over the first cable set, the first and second cable sets extending parallel to each other over the terminating side.

6. The cable assembly of claim 1, wherein the signal contacts of the contact array include signal pads and the contact array also includes ground pads, the signal conductors being terminated to the signal pads, each of the cable end portions including at least one of an exposed shielding layer or a drain wire that is terminated to a corresponding ground pad of the contact array, the ground shield being terminated to at least one ground pad.

7. The cable assembly of claim 1, wherein the mating array has a greater density of the electrical contacts than a density of the electrical contacts of the contact array.

8. The cable assembly of claim 1, wherein the contact array has multiple rows of the electrical contacts in which each row includes multiple electrical contacts, the signal contacts of the multiple rows of the contact array having corresponding signal conductors terminated thereto.

9. The cable assembly of claim 1, wherein the ground shield includes shield extensions, the shield extensions extending over respective signal pairs of the signal contacts and the signal conductors that are terminated to the respective signal pairs, the shield extension extending beyond corresponding distal ends of the signal conductors.

10. The cable assembly of claim 9, wherein the ground shield includes ramps that are positioned between adjacent shield extensions, each of the ramps extending over a different respective signal pair of the signal contacts and the signal conductors that are terminated to the different signal pair, the ramps extending beyond distal ends of the corresponding signal conductors.

11. A cable assembly comprising:
a carrier board having a terminating side and a mounting side that face in opposite directions, the terminating side including a contact array of electrical contacts, the mounting side including a mating array of electrical contacts, the contact array and the mating array being interconnected to each other through conductive pathways of the carrier board, wherein the electrical contacts of the contact array include signal contacts that form two signal rows; and
a plurality of cables having exposed signal conductors, the cables forming a first cable set and a second cable set, the signal conductors of the cables of the first cable set being terminated to the signal contacts of one of the signal rows, the signal conductors of the cables of the second cable set being terminated to the signal contacts of the other signal row, wherein the first cable set forms a first layer that extends adjacent to the terminating side and the second cable set forms a second layer that extends directly over the first layer, the first and second layers extending parallel to each other over the terminating side;
wherein the terminating side extends parallel to a longitudinal axis and a lateral axis that are perpendicular to each other, the electrical contacts of the contact array forming a lateral group of pad sets, each of the pad sets including a pair of signal pads and a ground pad, wherein the pad sets alternate between a first longitudinal position and a second longitudinal position as the lateral group extends laterally across the terminating side.

12. The cable assembly of claim 11, further comprising a ground shield that is coupled to the terminating side and separates the first and second layers of the cables.

13. The cable assembly of claim 12, wherein the ground shield includes a plurality of channels that receive corresponding cables of the second cable set, the channels being partially defined by ramps of the ground shield that direct the corresponding cables of the second cable set to be positioned above the first cable set.

14. The cable assembly of claim 11, further comprising a cover housing coupled to the carrier board and extending over the contact array and the first and second cable sets such that the first and second cable sets are disposed between the terminating side and the cover housing, the cover housing surrounding and holding the cables of the first and second cable sets to provide strain relief for the cables.

15. The cable assembly of claim 11, wherein each and every signal pad of the contact array has a corresponding signal conductor terminated thereto.

16. The cable assembly of claim 11, wherein the contact array defines a termination area and the mating array defines a mounting area, the termination and mounting areas overlapping each other such that the termination area extends over a majority of the mounting area.

17. A cable assembly comprising:
a carrier board having a terminating side and a mounting side that face in opposite directions, the terminating side extending parallel to a longitudinal axis and a lateral axis that are perpendicular to each other, the terminating side including a contact array of electrical contacts, the mounting side including a mating array of electrical contacts, the contact array and the mating array being interconnected to each other through conductive pathways of the carrier board, wherein the electrical contacts of the contact array form a lateral group that includes a plurality of separate pad sets, each of the pad sets including a pair of signal pads and a ground pad, wherein the pad sets alternate between a first longitudinal position and a second longitudinal position as the lateral group extends laterally across the terminating side; and
a plurality of cables each having a pair of signal conductors that are terminated to the signal pads of a corresponding pad set, each of the cables also including a drain wire or a shielding layer that is terminated to the ground pad of the corresponding pad set.

18. The cable assembly of claim 17, wherein the contact array defines a termination area and the mating array defines a mounting area, the termination and mounting areas overlapping each other such that the termination area extends over a majority of the mounting area.

19. The cable assembly of claim 17, wherein the lateral group is a first lateral group, the contact array including a second lateral group of pad sets that is adjacent to the first lateral group.

20. The cable assembly of claim 17, wherein at least some of the cables form a first cable set that extends adjacent to the terminating side and at least some of the cables form a second cable set that extends directly over the first cable set, the first and second cable sets extending parallel to each other over the terminating side.

* * * * *